United States Patent
Li

(10) Patent No.: US 10,809,560 B2
(45) Date of Patent: Oct. 20, 2020

(54) COLOR FILTER SUBSTRATE AND MANUFACTURING METHOD THEREOF

(71) Applicant: SHENZHEN CHINA STAR OPTOELECTRONICS TECHNOLOGY CO., LTD., Shenzhen, Guangdong (CN)

(72) Inventor: Lanyan Li, Guangdong (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 312 days.

(21) Appl. No.: 16/068,880

(22) PCT Filed: Mar. 6, 2018

(86) PCT No.: PCT/CN2018/078184
§ 371 (c)(1),
(2) Date: Jul. 9, 2018

(87) PCT Pub. No.: WO2019/140753
PCT Pub. Date: Jul. 25, 2019

(65) Prior Publication Data
US 2019/0361290 A1    Nov. 28, 2019

(30) Foreign Application Priority Data
Jan. 22, 2018    (CN) .......................... 2018 1 0060014

(51) Int. Cl.
*G02B 5/20*    (2006.01)
*G02F 1/1335*    (2006.01)
(Continued)

(52) U.S. Cl.
CPC ........ *G02F 1/133516* (2013.01); *G02B 1/111* (2013.01); *G02F 1/1339* (2013.01);
(Continued)

(58) Field of Classification Search
CPC ........ G02B 1/111; G02B 5/223; G02B 5/208; G02B 5/26; G02B 5/283; G02F 1/133502;
(Continued)

(56) References Cited

U.S. PATENT DOCUMENTS

| | | | | |
|---|---|---|---|---|
| 5,693,691 A | * | 12/1997 | Flaim | C08G 59/1455 523/436 |
| 2003/0038293 A1 | * | 2/2003 | Fasen | H01L 27/14632 257/88 |

(Continued)

FOREIGN PATENT DOCUMENTS

| | | |
|---|---|---|
| CN | 101322074 A | 12/2008 |
| CN | 101576629 A | 11/2009 |

(Continued)

*Primary Examiner* — John A McPherson
(74) *Attorney, Agent, or Firm* — Leong C. Lei

(57) ABSTRACT

A manufacturing method of a color filter substrate includes Step S1: providing a base and forming an antireflection layer on the base; and Step S2: forming a color resist layer on the antireflection layer, in which the color resist layer is formed through a photolithographic process including operations of coating photoresist, exposure, and development. With the arrangement of the antireflection layer under the color resist layer, in a photolithographic process of the color resist layer, due to the arrangement of the antireflection layer under the photoresist, during exposure of the photoresist, the antireflection layer absorbs ultraviolet light incident into the antireflection layer and weakens, through destructive interference, reflection light emitting from the contact interface between the photoresist and the antireflection layer to eliminate the standing wave effect, the swing effect, and the notching effect of photolithography and improve key dimension consistency and pattern distinguishability of the color resist units.

9 Claims, 11 Drawing Sheets

(51) Int. Cl.
  *G02B 1/111* (2015.01)
  *G02F 1/1339* (2006.01)
  *G02F 1/1362* (2006.01)
  *G03F 7/00* (2006.01)

(52) U.S. Cl.
  CPC .. *G02F 1/133502* (2013.01); *G02F 1/136209* (2013.01); *G02F 1/136227* (2013.01); *G03F 7/0007* (2013.01)

(58) Field of Classification Search
  CPC ......... G02F 1/133514; G02F 1/133516; G02F 1/136209; G02F 1/136227; G02F 2001/136227; G03F 7/0007
  USPC .............................................. 430/7; 349/106
  See application file for complete search history.

(56) References Cited

U.S. PATENT DOCUMENTS

2009/0169736 A1* 7/2009 Yoshizawa ............ G03F 7/0007
  427/162
2012/0104441 A1   5/2012 Park

FOREIGN PATENT DOCUMENTS

| CN | 102681068 A | 9/2012 |
| CN | 103235440 A | 8/2013 |
| CN | 104407471 A | 3/2015 |
| CN | 104733290 A | 6/2015 |
| CN | 105301831 A | 2/2016 |

* cited by examiner

COLOR FILTER SUBSTRATE AND MANUFACTURING METHOD THEREOF

RELATED APPLICATIONS

The present application is a National Phase of International Application Number PCT/CN2018/078184, filed Mar. 6, 2018, and claims the priority of China Application No. 201810060014.0, filed Jan. 22, 2018.

BACKGROUND OF THE INVENTION

1. Field of the Invention

The present invention relates to the field of display technology, and more particular to a color filter (CF) substrate and a manufacturing method thereof.

2. The Related Arts

With the progress of the display technology, flat panel display devices, such as liquid crystal displays (LCDs), due to various advantages, such as high image quality, low power consumption, thin device body, and being free of radiation, have been widely used in all sorts of consumer electronic products, including mobile phones, televisions, personal digital assistants (PDAs), digital cameras, notebook computers, and desktop computers, making them the main stream of display devices.

Most of the LCDs that are currently available in the market are backlighting LCDs, which comprise an enclosure, a liquid crystal display panel arranged in the enclosure, and a backlight module mounted inside the enclosure. A traditional liquid crystal display panel is formed by laminating a thin-film transistor (TFT) array substrate and a color filter (CF) substrate and the TFT array substrate and the CF substrate are respectively provided with a pixel electrode and a common electrode. Liquid crystal is filled between the TFT array substrate and the CF substrate. The working principle is that a driving voltage is applied between the pixel electrode and the common electrode and an electric field is established between the pixel electrode and the common electrode to control rotation of liquid crystal molecules of the liquid crystal layer refract out light emitting from the backlight module to generate an image. The CF substrate is provided with a color resist layer. The color resist layer filters backlighting such that three primary colors of red, green, and blue could be realized.

A so-call COA (Color Filter on Array) technology has also been used in the art, where the color resist layer is formed on the TFT array substrate for the purpose of avoiding issues of misalignment between the CF substrate and the array substrate and reducing the difficulty of a lamination process in the fabrication of a display panel, preventing errors occurring in lamination and thus increasing aperture ratio of pixels.

Recently, with the vivid development of the optio-electronic technology, the photolithography technology has been advancing in a direction toward higher resolution and line widths involved in red, green, and blue color resist units of a color resist layer are required to be increasingly smaller. However, in a photolithographic operation of the coloresist layer, since incident light may readily get reflected at a contact interface between the photoresist and a base so that the standing wave effect, the swing effect, and the notching effect may readily occur in exposure of the photoresist. Such an issue is even more significant is the currently prevailing COA type and POA (PS on Array) type display devices. Thus, improving the situation of formation of color resist units in a photolithographic operation is an urgent issue to be handled in the field.

SUMMARY OF THE INVENTION

Objectives of the present invention are to provide a manufacturing method of a color filter (CF) substrate, which arranges an antireflection layer under a color resist layer to help eliminate the standing wave effect, the swing effect, and the notching effect of the photolithographic operation and improve key dimension consistency and pattern distinguishability of the color resist units.

Objectives of the present invention are also to provide a CF substrate, in which an antireflection layer is arranged under a color resist layer to help improve key dimension consistency and pattern distinguishability of the color resist units so as to enhance resolution and displaying performance of a liquid crystal display including such a CF substrate.

To achieve the above objectives, the present invention provides a manufacturing method of a color filter substrate, which comprises the following steps:

Step S1: providing a base and forming an antireflection layer on the base; and

Step S2: forming a color resist layer on the antireflection layer, wherein the color resist layer is formed through a photolithographic process and the photolithographic process comprises operations of coating photoresist, exposure, and development.

The antireflection layer is formed of a material that comprises a polymer grafted with a light-absorbing group, wherein the light-absorbing group has a light absorption band of 200-400 nm; the antireflection layer is formed through a coating operation; and the antireflection layer has a thickness of 1-5 µm.

The light-absorbing group comprises one or more of naphthalene and anthracene, and the polymer comprises one or more of methyl phenolic epoxy resin and polyvinyl ether.

The base comprises a thin-film transistor (TFT) substrate and Step S1 comprises:

Step S11: providing a backing plate and forming a first metal layer on the backing plate, wherein the first metal layer comprises a gate electrode;

Step S12: forming a first insulation layer on the first metal layer and the backing plate to cover the first metal layer, and forming an active layer on the first insulation layer to be located above and corresponding in position to the gate electrode;

Step S13: forming a second metal layer on the active layer and the first insulation layer wherein the second metal layer comprises a source electrode and a drain electrode that are spaced from each other and the source electrode and the drain electrode are respectively in contact with two sides of the active layer;

Step S14: forming a second insulation layer on the second metal layer, the active layer, and the first insulation layer to make the base; and Step S15: forming the antireflection layer on the second insulation layer of the base.

The manufacturing method of the color filter substrate further comprises:

Step S3: forming a third insulation layer on the color resist layer and forming a through hole in the second insulation layer, the antireflection layer, the color resist layer, and the third insulation layer;

Step S4: forming a pixel electrode on the third insulation layer, wherein the pixel electrode is in contact engagement with the drain electrode by way of the through hole; and Step S5: forming, on the third insulation layer, a black matrix that is spaced from the pixel electrode and a photo spacer located on the black matrix.

The present invention also provides a color filter substrate, which comprises: a base, an antireflection layer arranged on the base, and a color resist layer arranged on the antireflection layer.

The antireflection layer is formed of a material that comprises a polymer grafted with a light-absorbing group, wherein the light-absorbing group has a light absorption band of 200-400 nm; the antireflection layer is formed through a coating operation; and the antireflection layer has a thickness of 1-5 μm.

The light-absorbing group comprises one or more of naphthalene and anthracene; and the polymer comprises one or more of methyl phenolic epoxy resin and polyvinyl ether.

The base comprises a thin-film transistor (TFT) substrate, wherein the TFT substrate comprises: a backing plate, a first metal layer arranged on the backing plate, a first insulation layer arranged on the first metal layer and the backing plate, an active layer arranged on the first insulation layer, a second metal layer arranged on the active layer and the first insulation layer, a second insulation layer arranged on the second metal layer, the active layer, and the first insulation layer;

the first metal layer comprises a gate electrode; and the active layer is located above the gate electrode; and the second metal layer comprises a source electrode and a drain electrode that are spaced from each other; and the source electrode and the drain electrode are respectively in contact with two sides of the active layer.

The color filter substrate further comprises: a third insulation layer arranged on the color resist layer, a pixel electrode arranged on the third insulation layer, a black ma arranged on the third insulation layer and spaced from the pixel electrode, and a photo spacer arranged on the black matrix; and the second insulation layer, the antireflection layer, the color resist layer, and the third insulation layer are formed therein with a through hole, and the pixel electrode is in contact with the drain electrode by way of the through hole.

The present invention further provides a manufacturing method of a color filter substrate, which comprises the following steps:

Step S1: providing a base and forming an antireflection layer on the base;

Step S2: forming a color resist layer on the antireflection layer, wherein the color resist layer is formed through a photolithographic process and the photolithographic process comprises operations of coating photoresist, exposure, and development;

wherein the antireflection layer is formed of a material that comprises a polymer grafted with a light-absorbing group, wherein the light-absorbing group has a light absorption band of 200-400 nm the antireflection layer is formed through a coating operation; and the antireflection layer has a thickness of 1-5 μm;

wherein the light-absorbing group comprises one or more of naphthalene and anthracene, and the polymer comprises one or more of methyl phenolic epoxy resin and polyvinyl ether; and wherein the base comprises a thin-film transistor (TFT) substrate and Step S1 comprises:

Step S11: providing a backing plate and forming a first metal layer on the backing plate, wherein the first metal layer comprises a gate electrode;

Step S12: forming a first insulation layer on the first metal layer and the backing plate to cover the first metal layer, and forming an active layer on the first insulation layer to be located above and corresponding in position to the gate electrode;

Step S13: forming a second metal layer on the active layer and the first insulation layer, wherein the second metal layer comprises a source electrode and a drain electrode that are spaced from each other and the source electrode and the drain electrode are respectively in contact with two sides of the active layer;

Step S14: forming a second insulation layer on the second metal layer, the active layer, and the first insulation layer to make the base; and Step S15: forming the antireflection layer on the second insulation layer of the base:

Step S3: forming a third insulation layer on the color resist layer and forming a through hole in the second insulation layer, the antireflection layer, the color resist layer, and the third insulation layer;

Step S4: forming a pixel electrode on the third insulation layer, wherein the pixel electrode is in contact engagement with the drain electrode by way of the through hole; and Step S5: forming, on the third insulation layer, a black matrix that is spaced from the pixel electrode and a photo spacer located on the black matrix.

The efficacy of the present invention is that the present invention the present invention provides a manufacturing method of a color filter substrate, which comprises arranging an antireflection layer under a color resist layer. In a photolithographic process of the color resist layer, due to the arrangement of the antireflection layer under the photoresist, in an exposure operation of the photoresist, the antireflection layer effectively absorbs ultraviolet light incident into the antireflection layer and weakens, through destructive interference, reflection light emitting from the contact interface between the photoresist and the antireflection layer so as to eliminate the standing wave effect, the swing effect, and the notching effect of photolithography and improve key dimension consistency and pattern distinguishability of the color resist units. The present invention provides a color filter substrate that comprises an antireflection layer arranged under a color resist layer to help improve key dimension consistency and pattern distinguishability of color resist units of the color resist layer so as to improve resolution and displaying performance of a liquid crystal display including the color filter substrate.

For better understanding of the features and technical contents of the present invention, reference will be made to the following detailed description of the present invention and the attached drawings. However, the drawings are provided only for reference and illustration and are not intended to limit the present invention.

BRIEF DESCRIPTION OF THE DRAWINGS

The technical solution, as well as other beneficial advantages, of the present invention will become apparent from the following detailed description of embodiments of the present invention, with reference to the attached drawings.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

An inventive idea of the present invention is to provide an antireflection layer under photoresist in order to effectively eliminate the standing wave effect, the swing effect, and the notching effect of photolithography and increase key dimension consistency and pattern distinguishability of the photoresist.

Figure 1:
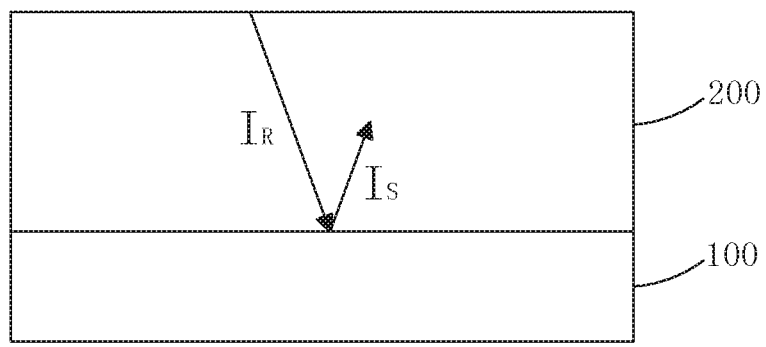
FIG. 1 is a schematic view illustrating incident light being reflected at a contact interface between photoresist and a base during a photoresist exposure operation.

FIG. 1 is a schematic view illustrating incident light $I_R$ being reflected at a contact interface between photoresist 200 and a base 100 during an exposure process of the photoresist 200. As shown in FIG. 1, during the exposure process of the photoresist 200, the incident light $I_R$ is reflected at the contact interface of the photoresist 200 and the base 100 and generate reflection light $I_S$. The reflection light $I_S$ is the reason that causes the standing wave effect, the swing effect, and the notching effect occurring in the exposure process of the photoresist 200 and affecting the formation performance of the photoresist 200.

Figure 2:
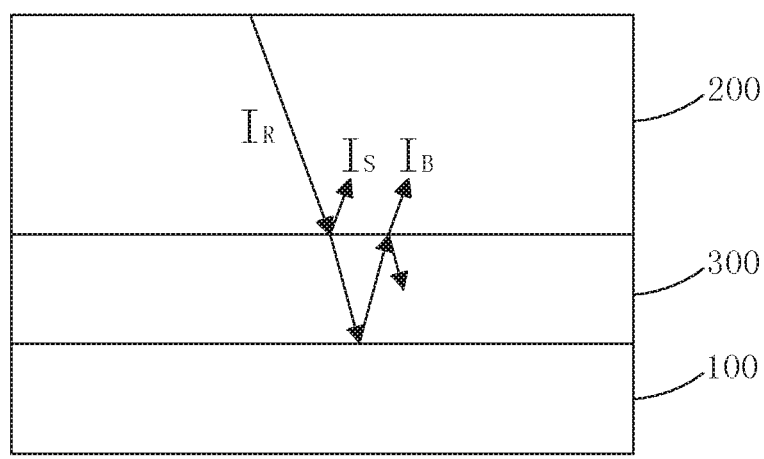
FIG. 2 is a schematic view illustrating weakening of reflection light by means of an antireflection layer arranged between the photoresist and the base shown in FIG. 1.

FIG. 2 is a schematic view illustrating weakening of the reflection light $I_R$ after an antireflection layer 300 is arranged between the photoresist 200 and the base 100 of FIG. 1. As shown in FIG. 2, after the antireflection layer 300 is arranged between the photoresist 200 and the base 100, two mechanisms are involved for the antireflection layer 300 to reduce the reflection rate of the incident light $I_R$. The first one is light-absorbing groups inherently included in the antireflection layer 300 to absorb a large amount of ultraviolet light; and the second one is a part of the incident light $I_R$ that enters the photoresist 200 is reflected at the contact interface between the photoresist 200 and the antireflection layer 300 to generate first reflection light $I_S$, and at the same time, another part of the incident light $I_R$ that enters the photoresist 200 is refracted and enters the antireflection layer 300 to get reflected at the contact interface between the antireflection layer 300 and the base 100 so that reflection light so generated re-enters the photoresist 200 to form second reflection light $I_B$. The first reflection light $I_S$ and the second reflection light $I_B$ generate destructive interference therebetween to further weaken reflection light. With the two above-described mechanisms, the antireflection layer 300 can significantly reduce the reflection rate of the incident light $I_R$ entering the photoresist 200 so as to effectively eliminate the standing wave effect, the swing effect, and the notching effect of photolithography, and thus enhance key dimension consistency and pattern distinguishability of the photoresist 200.

Figure 3:
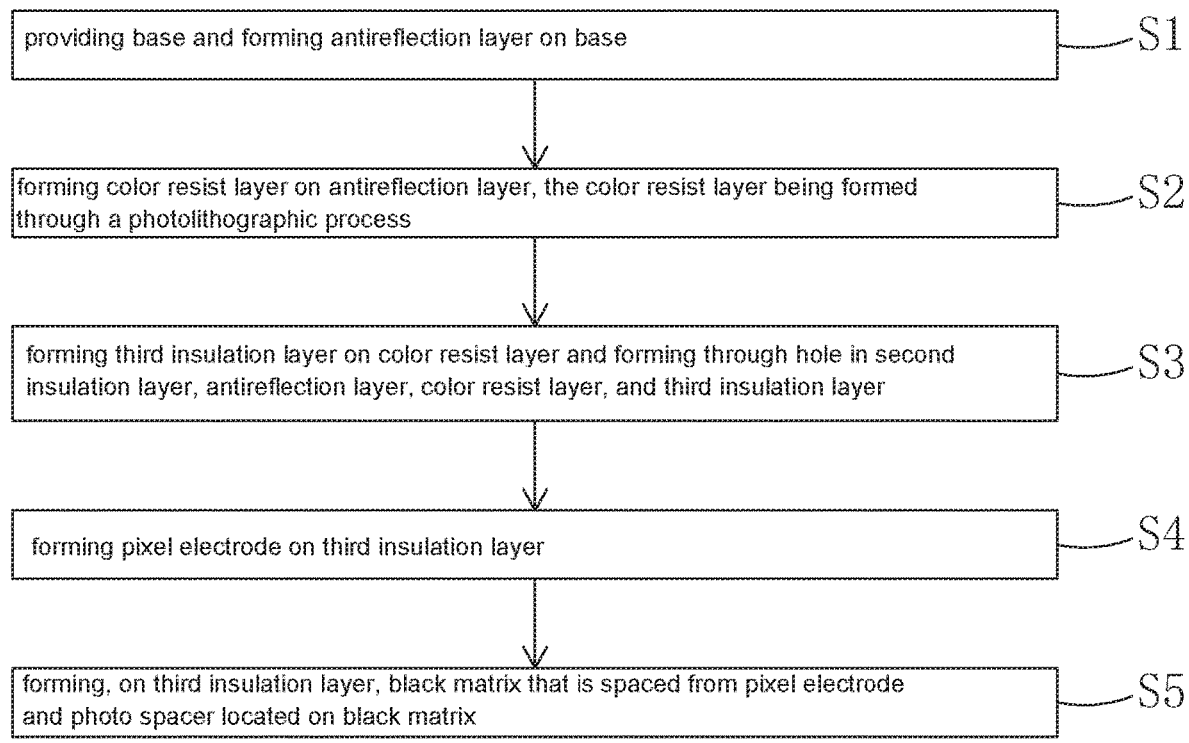
FIG. 3 is a flow chart illustrating a manufacturing method of a color filter (CF) substrate according to the present invention.

Referring to FIG. 3, the present invention provides a manufacturing method of a color filter substrate, which comprises the following steps:

Step S1: as shown in FIGS. 4-8, providing a base 10 and forming an antireflection layer 61 on the base 10.

Specifically, the antireflection layer 61 is formed of a material that comprises a polymer grafted with a light-absorbing group, wherein the light-absorbing group has a light absorption band of 200-400 nm, so that the antireflection layer 61 has a light absorption band of 200-400 nm.

Specifically, the antireflection layer 61 is formed through a coating operation.

Specifically, the antireflection layer 61 has a thickness of 1-5 μm.

Specifically, the light-absorbing group comprises one or more of naphthalene and anthracene, and the polymer comprises one or more of methyl phenolic epoxy resin and polyvinyl ether.

Specifically, the base 10 can be a mother substrate or a thin-film transistor (TFT) substrate. When the base 10 is a TFT substrate, a color filter substrate that is manufactured subsequently is a COA array substrate.

Figure 4:
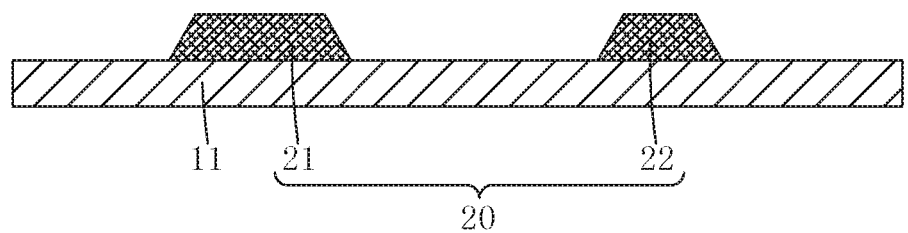
FIG. 4 is a cross-sectional view illustrating Step S11 of the manufacturing method of the CF substrate according to the present invention.

When the base 10 is a TFT substrate, Step S1 specifically comprises:

Step S11: as shown in FIG. 4, providing a backing plate 11 and forming a first metal layer 20 on the backing plate 11, wherein the first metal layer 20 comprises a gate electrode 21.

Specifically, the backing plate 11 comprises a mother glass plate.

Specifically, a manufacturing process of the first metal layer 20 comprises operations of physical vapor deposition (PVD), photoresist coating, exposure (PHOTO), wet etching (WET), and photoresist stripping (STRIP).

Specifically, the first metal layer 20 is formed of a material that comprises at least one of aluminum and alloys thereof, copper and alloys thereof, and molybdenum and alloys thereof.

Specifically, the first metal layer 20 further comprises a common electrode line 22 spaced from the gate electrode 21. After the formation of the array substrate, the array substrate and a common-electrode-carrying-substrate are laminated such that the common electrode line 22 of the array substrate and a common electrode of the common-electrode-carrying substrate are connected through line connection terminals and the common electrode line 22 supplies a voltage signal to the common electrode.

Figure 5:
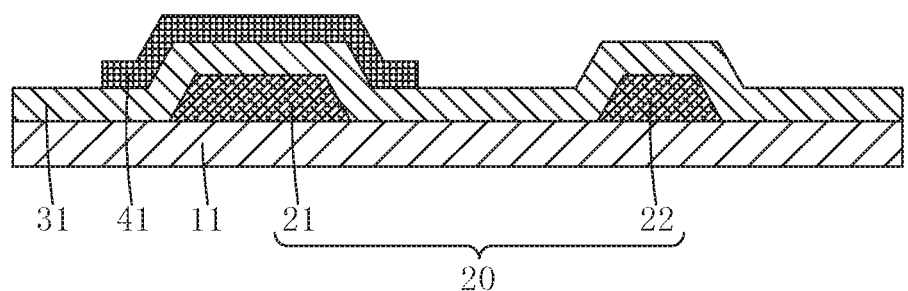
FIG. 5 is a cross-sectional view illustrating Step S12 of the manufacturing method of the CF substrate according to the present invention.

Step S12: as shown in FIG. 5, forming a first insulation layer 31 on the first metal layer 20 and the backing plate 11 to cover the first metal layer 20, and forming an active layer 41 on the first insulation layer 31 to be located above and corresponding in position to the gate electrode 21.

Specifically, the first insulation layer 31 is formed through chemical vapor deposition (CVD) and the first insulation layer 31 comprises a silicon nitride (SiNx) layer.

Specifically, a manufacturing process of the active layer 41 comprises operations of chemical vapor deposition (CVD), photoresist coating, exposure (PHOTO), dry etching (DRY), and photoresist stripping (STRIP).

Specifically, the active layer 41 is formed of a material comprising amorphous silicon or poly-silicon.

Figure 6:
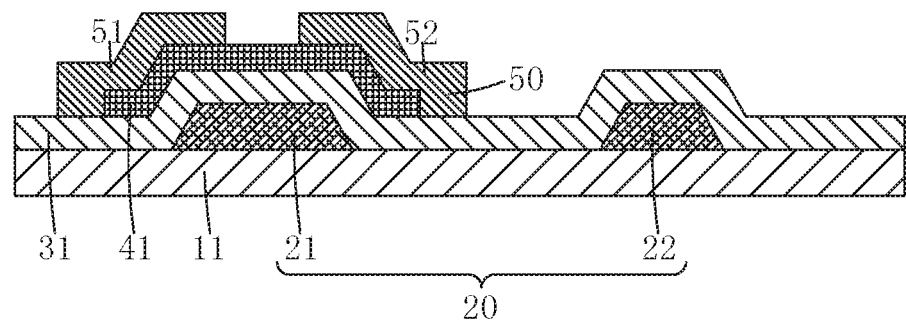
FIG. 6 is a cross-sectional view illustrating Step S13 of the manufacturing method of the CF substrate according to the present invention.

Step S13: as shown in FIG. 6, forming a second metal layer 50 on the active layer 41 and the first insulation layer 31, wherein the second metal layer 50 comprises a source electrode 51 and a drain electrode 52 that are spaced from each other and the source electrode 51 and the drain electrode 52 are respectively in contact with two sides of the active layer 41.

Specifically, a manufacturing process of the second metal layer 50 comprises operations of physical vapor deposition (PVD), photoresist coating, exposure (PHOTO), wet etching (WET), and photoresist stripping (STRIP).

Specifically, the second metal layer 50 is formed of a material that comprises at least one of aluminum and alloys thereof, copper and alloys thereof, and molybdenum and alloys thereof.

Figure 7:
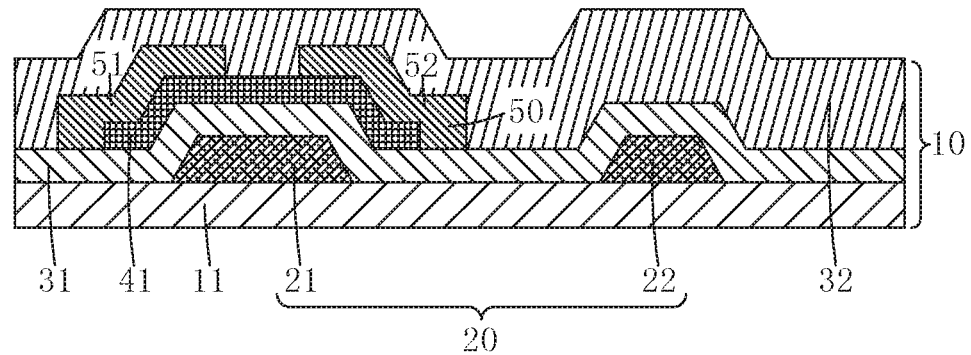
FIG. 7 is a cross-sectional view illustrating Step S14 of the manufacturing method of the CF substrate according to the present invention.

Step S14: as shown in FIG. 7, forming a second insulation layer 32 on the second metal layer 50, the active layer 41, and the first insulation layer 31 to make the base 10.

Specifically, the second insulation layer 32 is formed through chemical vapor deposition (CVD) and the second insulation layer 32 comprises a silicon nitride (SiNx) layer.

Figure 8:
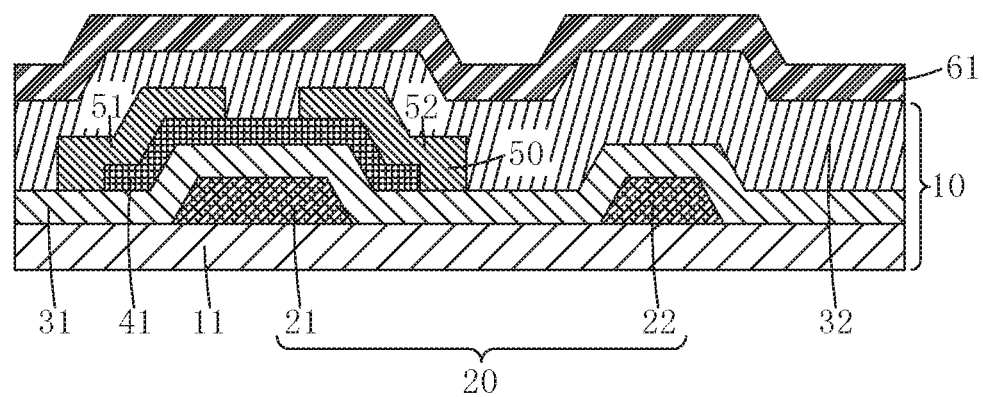
FIG. 8 is a cross-sectional view illustrating Step S15 of the manufacturing method of the CF substrate according to the present invention.

Step S15: as shown in FIG. 8, forming the antireflection layer 61 on the second insulation layer 32 of the base 10.

Figure 9:
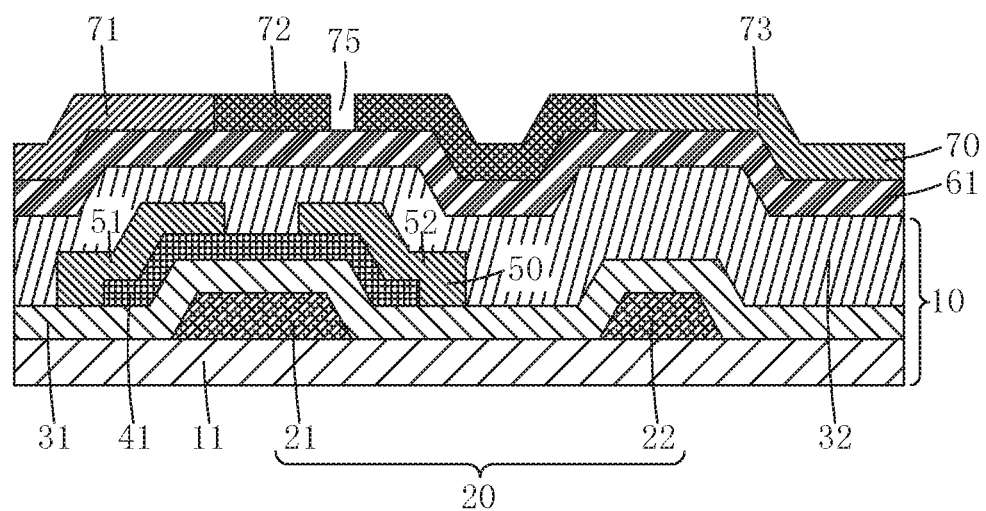
FIG. 9 is a cross-sectional view illustrating Step S2 of the manufacturing method of the CF substrate according to the present invention.

Step S2: as shown in FIG. 9, forming a color resist layer 70 on the antireflection layer 61, wherein the color resist layer 70 is formed through a photolithographic process and the photolithographic process comprises operations of coating photoresist, exposure, and development.

Specifically, the coloresist layer 70 comprises a plurality of red color resist units 71, a plurality of green color resist units 72, and a plurality of blue color resist units 73 that are arranged in an array.

Specifically, the red color resist units 71 are formed of a red color resist material with the photolithographic process; the green color resist units 72 are formed of the green color resist material with the photolithographic process; and the blue color resist units 73 are formed of a blue color resist material with the photolithographic process; sequence of forming the red color resist units 71, the green color resist units 72, and the blue color resist units 73 is not limited.

Specifically, the color resist layer 70 formed in Step S2 comprises a first via 75 that is located above and corresponds, in position, to the drain electrode 52.

In Step S2, in the photolithographic process of the color resist layer 70, due to the antireflection layer 61 arranged under the photoresist, the antireflection layer 61 can effectively absorb ultraviolet light incident in the antireflection layer 61 during an exposure operation of the photoresist and can weaken, through destructive interference, the reflection light emitting from the contact interface between the photoresist and the antireflection layer 61 so as to eliminate the standing wave effect, the swing effect, and the notching effect of photolithography and improve key dimension consistency and pattern distinguishability of the color resist units.

On the other hand, the present invention also provides the following technical effects by arranging the color resist layer 70 on the antireflection layer 61:

In the prior art, the photoresist material is often set n direct contact with the base that is inorganic. The photoresist material commonly includes a silane coupling agent. The mechanism that the photoresist material attaches to the inorganic base includes: (1) the silane coupling agent contained in the photoresist material is hydrolyzed into silanol; (2) silanol is condensed into a lower polymer; (3) the low polymer and hydroxyl groups (—OH) on a surface of the inorganic base form hydrogen bonds; (4) under a dry curing condition, the low polymer and the hydroxyl groups on the surface of the inorganic base are condensed and dehydrated to form covalent bonds. However, such a way of coupling required extremely high conditions for the characteristics of the photoresist material and the manufacturing process, imposing limitation to the application of the photoresist material and increasing the development cost of the photoresist material. The present invention provides an antireflection layer 61 that is made of an organic material to be coated on a surface of the inorganic base and compared to the inorganic base, the surface of the antireflection layer 61 contains more hydroxyl groups, has a large surface tension and a powerful wetting capability, and the coupling effect between the photoresist material and the antireflection layer 61 is better so that the attachment of the photoresist is significant improved to thereby effectively improve the peeling issue of photoresist.

Figure 10:
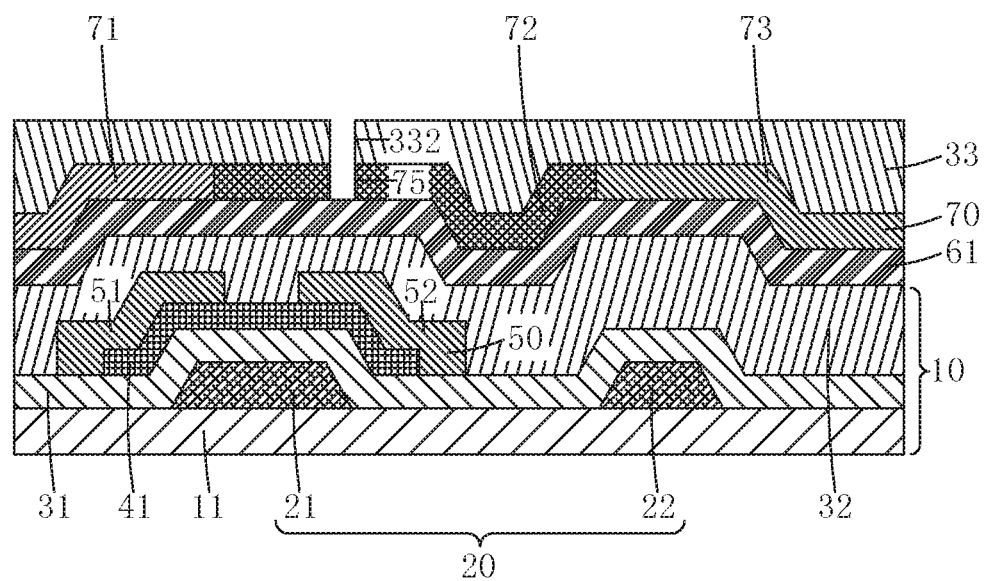
FIG. 10 is a cross-sectional view illustrating Step S31 of the manufacturing method of the CF substrate according to the present invention.
Figure 11:
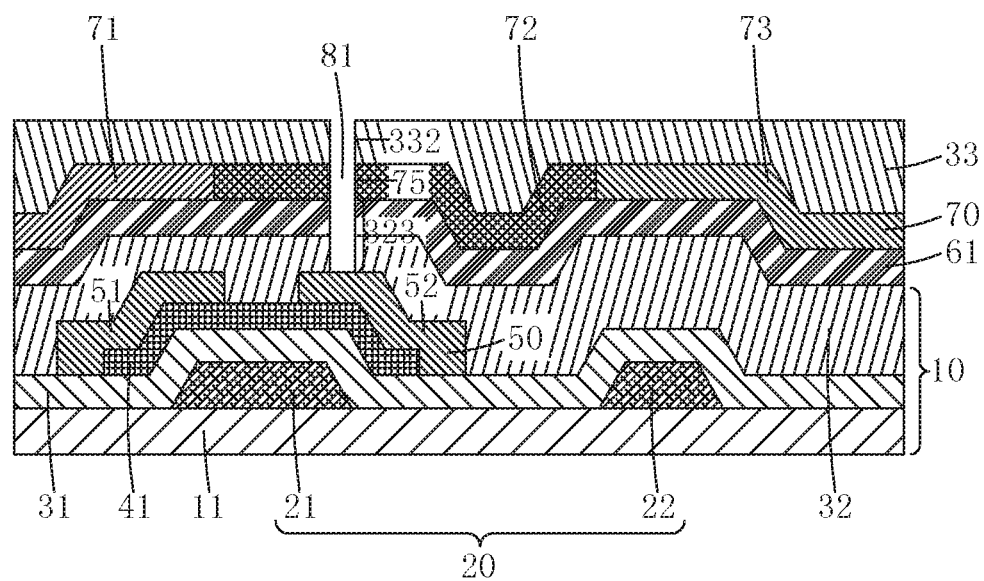
FIG. 11 is a cross-sectional view illustrating Step S32 of the manufacturing method of the CF substrate according to the present invention.

Specifically, when the base 10 provided in Step S1 is a TFT substrate, the manufacturing method of the color filter substrate further comprises:

Step S3: as shown in FIGS. 10-11, forming a third insulation layer 33 on the color resist layer 70 and forming a through hole 81 in the second insulation layer 32, the antireflection layer 61, the color resist layer 70, and the third insulation layer 33.

Step S3 specifically comprises:

Step S31: as shown in FIG. 10, forming the third insulation layer 33 on the color resist layer 70 and forming a second via 332 in the third insulation layer 33 to correspond to the first via 75; and Step S32: as shown in FIG. 11, subjecting the second insulation layer 32 and the antireflection layer 61 to dry etching by using the third insulation layer 33 and the color resist layer 70 as a mask so as to form a third via 323 in the second insulation layer 32 and the antireflection layer 61, wherein the first via 75, the second via 332, and the third via 323 are in communication with each other to collectively form the through hole 81.

Specifically, in Step S32, an operation of dry etching of the second insulation layer 32 and the antireflection layer 61 comprises plasma bombardment, wherein the plasma is inert gas plasma and the inert gas is preferably argon. Specifically, the third insulation layer 33 is an organic planarization layer or an inorganic passivation layer. When the third insulation layer 33 is an organic planarization layer, the organic planarization layer is formed of a material that comprises a photoresist material; the third insulation layer 33 is formed through coating; and when the third insulation layer 33 is an inorganic passivation layer, the third insulation layer 33 is formed through chemical vapor deposition (CVD) and the inorganic passivation layer is preferably a silicon nitride (SiNx) layer.

Specifically, when the third insulation layer 33 is an organic planarization layer, Step S31 may further comprise: forming, on the color resist layer 70, an antireflection layer (not shown) that is located between the color resist layer 70 and the third insulation layer 33. The antireflection layer helps improve shaping performance of forming the second via 332 in the third insulation layer 33.

Figure 12:
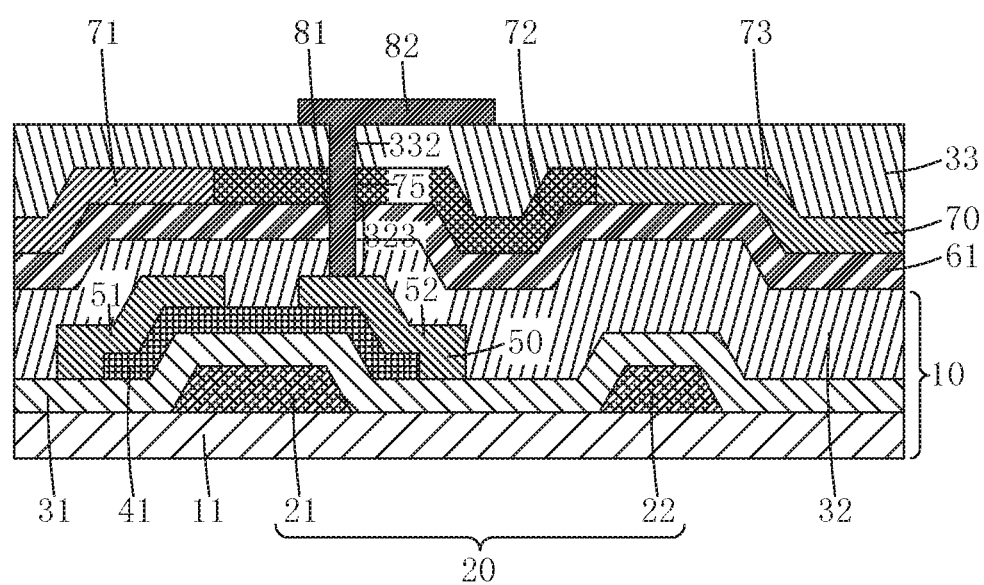
FIG. 12 is a cross-sectional view illustrating Step S4 of the manufacturing method of the CF substrate according to the present invention.

Step S4: as shown in FIG. 12, forming a pixel electrode 82 on the third insulation layer 33, wherein the pixel electrode 82 is in contact engagement with the drain electrode 52 by way of the through hole 81.

Specifically, the pixel electrode 82 is formed of a material comprising indium tin oxide (ITO).

Figure 13:
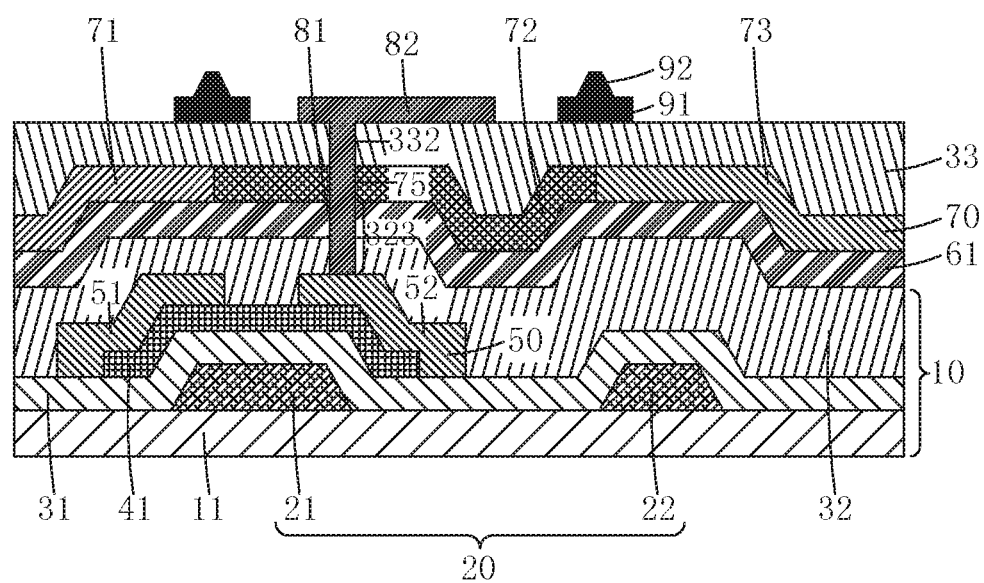
FIG. 13 is a cross-sectional view illustrating Step S5 of the manufacturing method of the CF substrate according to the present invention, and is also a schematic cross-sectional view illustrating a CF substrate according to the present invention.

Step S5: as shown in FIG. 13, forming, on the third insulation layer 33, a black matrix 91 that is spaced from the pixel electrode 82 and a photo spacer 92 located on the black matrix 91.

Preferably, the black matrix 91 and the photo spacer 92 are formed of the same material in n grated unitary form.

Specifically, Step S5 may further comprises: forming, on the third insulation layer 33, an antireflection layer (not shown) that is located between the third insulation layer 33 and the black matrix 91, wherein the antireflection layer helps improve shaping performance of the black matrix 91 and the photo spacer 92.

The above-described manufacturing method of a color filter substrate includes arranging an antireflection layer 61 under the color resist layer 70. In a photolithographic process of the color resist layer 70, due to the arrangement of the antireflection layer 61 under the photoresist, in an exposure operation of the photoresist, the antireflection layer 61 effectively absorbs ultraviolet light incident into the antireflection layer 61 and weakens, through destructive interference, reflection light emitting from the contact interface between the photoresist and the antireflection layer 61 so as to eliminate the standing wave effect, the swing effect, and the notching effect of photolithography and improve key dimension consistency and pattern distinguishability of the color resist units.

Referring to FIG. 13, based on the above-described manufacturing method of a color filter substrate, the present invention also provides a color filter substrate, which comprises: a base 10, an antireflection layer 61 arranged on the base 10, and a color resist layer 70 arranged on the antireflection layer 61.

Specifically, the antireflection layer 61 is formed of a material that comprises a polymer grafted with a light-absorbing group, wherein the light-absorbing group has a light absorption band of 200-400 nm, so that the antireflection layer 61 has a light absorption band of 200-400 nm.

Specifically, the antireflection layer 61 has a thickness of 1-5 μm.

Specifically, the light-absorbing group comprises one or more of naphthalene and anthracene, the polymer comprises one or more of methyl phenolic epoxy resin and polyvinyl ether.

Specifically, the coloresist layer 70 comprises a plurality of red color resist units 71, a plurality of green color resist units 72, and a plurality of blue color resist units 73 that are arranged in an array.

Specifically, the base 10 can be a mother substrate or a TFT substrate. The TFT substrate may comprise: a backing plate 11, a first metal layer 20 arranged on the backing plate 11, a first insulation layer 31 arranged on the first metal layer 20 and the backing plate active layer 41 arranged on the first insulation layer 31, a second metal layer 50 arranged on the active layer 41 and the first insulation layer 31, a second insulation layer 32 arranged on the second metal layer 50, the active layer 41, and the first insulation layer 31.

The first metal layer 20 comprises a gate electrode 21; and the active layer 41 is arranged to be located above and correspond, in position, to the gate electrode 21.

The second metal layer 50 comprises a source electrode 51 and a drain electrode 52 that are spaced from each other. The source electrode 51 and the drain electrode 52 are respectively in contact with two sides of the active layer 41.

Specifically, when the base 10 is a TFT substrate, the color filter substrate is a COA array substrate.

Specifically, when the base 10 is a TFT substrate, the color filter substrate further comprises: a third insulation layer 33 arranged on the color resist layer 70, a pixel electrode 82 arranged on the third insulation layer 33, and a black matrix 91 arranged on the third insulation layer 33 and a photo spacer 92 arranged on the black matrix 91, which are spaced from the pixel electrode 82.

The second insulation layer 32, the antireflection layer 61, the color resist layer 70, and the third insulation layer 33 are formed therein with a through hole 81, and the pixel electrode 82 is in contact with the drain electrode 52 by way of the through hole 81.

Specifically, the backing plate 11 comprises a mother glass plate.

Specifically, the first metal layer 20 is formed of a material that comprises at least one of aluminum and alloys thereof, copper and alloys thereof, and molybdenum and alloys thereof.

Specifically, the first metal layer 20 further comprises a common electrode line 22 that is spaced from the gate electrode 21.

Specifically, the first insulation layer 31 is a silicon nitride (SiNx) layer.

Specifically, the active layer 41 is formed of a material comprising amorphous silicon or poly-silicon.

Specifically, the second metal layer 50 is formed of a material that comprises at least one of aluminum and alloys thereof, copper and alloys thereof, and molybdenum and alloys thereof.

Specifically, the second insulation layer 32 is a silicon nitride (SiNx) layer.

Specifically, the third insulation layer 33 is an organic planarization layer or an inorganic passivation layer. When the third insulation layer 33 is an organic planarization layer, the organic planarization layer is formed of a material that comprises a photoresist material; and when the third insulation layer 33 is an inorganic passivation layer, the inorganic passivation layer is preferably a silicon nitride (SiNx) layer.

Preferably, the black matrix 91 and the photo spacer 92 are formed of the same material in an integrated unitary form.

Specifically, the pixel electrode 82 is formed of a material comprising indium tin oxide (ITO).

Specifically, the through hole 81 comprises: a first via 75 formed in the color resist layer 70, a second via 332 formed in the third insulation layer 33, and a third via 323 formed in the second insulation layer 32 and the antireflection layer 61; the first via 75, the second via 332, and the third via 323 are in communication with each other.

Specifically, the color substrate may further comprise an antireflection layer (not shown) located between the color resist layer 70 and the third insulation layer 33, and may further comprise an antireflection layer (not shown) located between the third insulation layer 33 and the black matrix 91.

The above-described color filter substrate comprises an antireflection layer 61 arranged under the color resist layer 70 to help improve key dimension consistency and pattern distinguishability of color resist units of the color resist layer 70 so as to improve resolution and displaying performance of a liquid crystal display including the color filter substrate.

In summary, the present invention provides a manufacturing method of a color filter substrate, which comprises arranging an antireflection layer under a color resist layer. In a photolithographic process of the color resist layer, due to the arrangement of the antireflection layer under the photoresist, in an exposure operation of the photoresist, the antireflection layer effectively absorbs ultraviolet light incident into the antireflection layer and weakens, through destructive interference, reflection light emitting from the contact interface between the photoresist and the antireflection layer so as to eliminate the standing wave effect, the swing effect, and the notching effect of photolithography and improve key dimension consistency and pattern distinguishability of the color resist units. The present invention provides a color filter substrate that comprises an antireflection layer arranged under a color resist layer to help improve key dimension consistency and pattern distinguishability of color resist units of the color resist layer so as to improve resolution and displaying performance of a liquid crystal display including the color filter substrate.

Based on the description given above, those having ordinary skills in the art may easily contemplate various changes and modifications of the technical solution and the technical ideas of the present invention. All these changes and modifications are considered belonging to the protection scope of the present invention as defined in the appended claims.

What is claimed is:

1. A manufacturing method of a color filter substrate, comprising the following steps:
   Step S1: providing a base and forming an antireflection layer on the base; and
   Step S2: forming a color resist layer on the antireflection layer, wherein the color resist layer is formed through a photolithographic process and the photolithographic process comprises operations of coating photoresist, exposure, and development;
   wherein the base comprises a thin-film transistor (TFT) substrate and Step S1 comprises:
   Step S11: providing a backing plate and forming a first metal layer on the backing plate, wherein the first metal layer comprises a gate electrode;
   Step S12: forming a first insulation layer on the first metal layer and the backing plate to cover the first metal layer, and forming an active layer on the first insulation layer to be located above and corresponding in position to the gate electrode;
   Step S13: forming a second metal layer on the active layer and the first insulation layer, wherein the second metal layer comprises a source electrode and a drain electrode that are spaced from each other and the source electrode and the drain electrode are respectively in contact with two sides of the active layer;
   Step S14: forming a second insulation layer on the second metal layer, the active layer, and the first insulation layer to make the base; and
   Step S15: forming the antireflection layer on the second insulation layer of the base.

2. The manufacturing method of the color filter substrate according to claim 1, wherein the antireflection layer is formed of a material that comprises a polymer grafted with a light-absorbing group, wherein the light-absorbing group has a light absorption band of 200-400 nm; the antireflection layer is formed through a coating operation; and the antireflection layer has a thickness of 1-5 μm.

3. The manufacturing method of the color filter substrate according to claim 2, wherein the light-absorbing group comprises one or more of naphthalene and anthracene, and the polymer comprises one or more of methyl phenolic epoxy resin and polyvinyl ether.

4. The manufacturing method of the color filter substrate according to claim 1, further comprising:
   Step S3: forming a third insulation layer on the color resist layer and forming a through hole in the second insulation layer, the antireflection layer, the color resist layer, and the third insulation layer;
   Step S4: forming a pixel electrode on the third insulation layer, wherein the pixel electrode is in contact engagement with the drain electrode by way of the through hole; and
   Step S5: forming, on the third insulation layer, a black matrix that is spaced from the pixel electrode and a photo spacer located on the black matrix.

5. A color filter substrate, comprising: a base, an antireflection layer arranged on the base, and a color resist layer arranged on the antireflection layer;
   wherein the base comprises a thin-film transistor (TFT) substrate, wherein the TFT substrate comprises: a backing plate, a first metal layer arranged on the backing plate, a first insulation layer arranged on the first metal layer and the backing plate, an active layer arranged on the first insulation layer, a second metal layer arranged on the active layer and the first insulation layer, a second insulation layer arranged on the second metal layer, the active layer, and the first insulation layer;
   the first metal layer comprises a gate electrode; and the active layer is located above the gate electrode; and
   the second metal layer comprises a source electrode and a drain electrode that are spaced from each other; and the source electrode and the drain electrode are respectively in contact with two sides of the active layer.

6. The color filter substrate according to claim 5, wherein the antireflection layer is formed of a material that comprises a polymer grafted with a light-absorbing group, wherein the light-absorbing group has a light absorption band of 200-400 nm; the antireflection layer is formed through a coating operation; and the antireflection layer has a thickness of 1-5 μm.

7. The color filter substrate according to claim 6, wherein the light-absorbing group comprises one or more of naphthalene and anthracene; and the polymer comprises one or more of methyl phenolic epoxy resin and polyvinyl ether.

8. The color filter substrate according to claim 5, further comprising: a third insulation layer arranged on the color resist layer, a pixel electrode arranged on the third insulation layer, a black matrix arranged on the third insulation layer and spaced from the pixel electrode, and a photo spacer arranged on the black matrix; and
   the second insulation layer, the antireflection layer, the color resist layer, and the third insulation layer are formed therein with a through hole, and the pixel electrode is in contact with the drain electrode by way of the through hole.

9. A manufacturing method of a color filter substrate, comprising the following steps:

Step S1: providing a base and forming an antireflection layer on the base;

Step S2: forming a color resist layer on the antireflection layer, wherein the color resist layer is formed through a photolithographic process and the photolithographic process comprises operations of coating photoresist, exposure, and development;

wherein the antireflection layer is formed of a material that comprises a polymer grafted with a light-absorbing group, wherein the light-absorbing group has a light absorption band of 200-400 nm; the antireflection layer is formed through a coating operation; and the antireflection layer has a thickness of 1-5 μm;

wherein the light-absorbing group comprises one or more of naphthalene and anthracene, and the polymer comprises one or more of methyl phenolic epoxy resin and polyvinyl ether; and wherein the base comprises a thin-film transistor (TFT) substrate and Step S1 comprises:

Step S11: providing a backing plate and forming a first metal layer on the backing plate, wherein the first metal layer comprises a gate electrode;

Step S12: forming a first insulation layer on the first metal layer and the backing plate to cover the first metal layer, and forming an active layer on the first insulation layer to be located above and corresponding in position to the gate electrode;

Step S13: forming a second metal layer on the active layer and the first insulation layer, wherein the second metal layer comprises a source electrode and a drain electrode that are spaced from each other and the source electrode and the drain electrode are respectively in contact with two sides of the active layer;

Step S14: forming a second insulation layer on the second metal layer, the active layer, and the first insulation layer to make the base; and Step S15: forming the antireflection layer on the second insulation layer of the base;

Step S3: forming a third insulation layer on the color resist layer and forming a through hole in the second insulation layer, the antireflection layer, the color resist layer, and the third insulation layer;

Step S4: forming a pixel electrode on the third insulation layer, wherein the pixel electrode is in contact engagement with the drain electrode by way of the through hole; and Step S5: forming, on the third insulation layer, a black matrix that is spaced from the pixel electrode and a photo spacer located on the black matrix.

* * * * *